United States Patent
Shin et al.

(10) Patent No.: US 10,134,825 B2
(45) Date of Patent: Nov. 20, 2018

(54) ORGANIC LIGHT EMITTING DIODE DISPLAY

(71) Applicant: LG Display Co., Ltd., Seoul (KR)

(72) Inventors: Sangil Shin, Goyang-si (KR); Jungyoup Suk, Paju-si (KR); Byongwook Shin, Daegu (KR)

(73) Assignee: LG Display Co., Ltd., Seoul (KR)

( * ) Notice: Subject to any disclaimer, the term of this patent is extended or adjusted under 35 U.S.C. 154(b) by 118 days.

(21) Appl. No.: 15/331,622

(22) Filed: Oct. 21, 2016

(65) Prior Publication Data

US 2017/0154945 A1    Jun. 1, 2017

(30) Foreign Application Priority Data

Nov. 30, 2015 (KR) .................. 10-2015-0169237

(51) Int. Cl.
*G09G 3/36* (2006.01)
*H01L 27/32* (2006.01)
(Continued)

(52) U.S. Cl.
CPC .......... *H01L 27/3276* (2013.01); *G09G 3/32* (2013.01); *G09G 3/3225* (2013.01);
(Continued)

(58) Field of Classification Search
CPC ............ G09G 2310/027; G09G 5/006; G09G 2320/0626; G09G 2360/145;
(Continued)

(56) References Cited

U.S. PATENT DOCUMENTS

| 2010/0141630 | A1 | 6/2010 | Kimura |
| 2014/0022230 | A1* | 1/2014 | Hasumi ............... G09G 3/3696 345/212 |

(Continued)

FOREIGN PATENT DOCUMENTS

| CN | 104614911 A | 5/2015 |
| CN | 104977740 A | 10/2015 |

(Continued)

OTHER PUBLICATIONS

European Extended Search Report, European Application No. 16187883.0, dated Jun. 28, 2017, 17 pages.
(Continued)

*Primary Examiner* — Duc Q Dinh
(74) *Attorney, Agent, or Firm* — Fenwick & West LLP

(57) ABSTRACT

A display device including a substrate comprising a free form active area having pixels defined by scan lines, data lines, and power supply lines, and a bezel area located outside the active area and having power supply routing lines to which a power supply voltage is applied and scan routing lines to which scan pulses are applied; and link lines that are disposed in the bezel area, and that connect the power supply routing lines to the power supply lines and transmit the power supply voltage from the power supply routing lines to the power supply lines, the link lines comprising: a plurality of first link lines; and one or more second link lines that interconnect the first link lines, each of the first link lines comprising one end connected to the power supply routing lines and the other end connected to the power supply lines.

18 Claims, 14 Drawing Sheets

(51) Int. Cl.
*G09G 3/3233* (2016.01)
*G09G 3/3266* (2016.01)
*H01L 51/00* (2006.01)
*G09G 3/32* (2016.01)
*G09G 3/3225* (2016.01)
*G09G 3/3275* (2016.01)

(52) U.S. Cl.
CPC ......... *G09G 3/3233* (2013.01); *G09G 3/3266* (2013.01); *H01L 51/0097* (2013.01); *G09G 3/3275* (2013.01); *G09G 2300/0408* (2013.01); *G09G 2300/0426* (2013.01); *G09G 2310/0281* (2013.01); *G09G 2310/0297* (2013.01); *G09G 2320/0223* (2013.01); *G09G 2330/02* (2013.01); *H01L 2251/5338* (2013.01); *H01L 2251/5392* (2013.01)

(58) Field of Classification Search
CPC ....... G09G 2360/147; G09G 2360/148; G09G 3/3413; G09G 3/3266; G09G 2310/0281; G09G 2320/0233; G09G 2310/0286; G09G 2310/0232; G09G 2320/0209; G09G 3/3685; G09G 2310/0278; G09G 3/32; G09G 3/3225; G09G 3/3233

USPC ............................ 345/73–76, 87, 98, 99, 100
See application file for complete search history.

(56) References Cited

U.S. PATENT DOCUMENTS

2014/0139422 A1* 5/2014 Mistry .................... G06F 3/014
 345/156
2017/0033123 A1* 2/2017 Lv ......................... H01L 27/124

FOREIGN PATENT DOCUMENTS

EP 2889864 A1 7/2015
EP 2980854 A1 2/2016

OTHER PUBLICATIONS

European Partial Search Report, European Application No. 16187883.0, dated Mar. 1, 2017, 7 pages.

* cited by examiner

ORGANIC LIGHT EMITTING DIODE DISPLAY

CROSS-REFERENCE TO RELATED APPLICATION

This application claims the priority benefit of Korean Patent Application No. 10-2015-0169237 filed on Nov. 30, 2015, which is hereby incorporated herein by reference for all purposes as if fully set forth herein.

BACKGROUND

Field of the Invention

The present invention relates to a display device with a free form active area.

Discussion of the Related Art

With the development of information technology, the market for displays that play an intermediary role between users and information is growing. Thus, display devices such as organic light emitting displays (OLEDs), quantum dot displays (QDDs), liquid crystal displays (LCDs), and plasma display panels (PDPs) are increasingly used.

Moreover, flexible displays have become commercialized in recent years. The flexible displays come in a variety of designs, and offer benefits such as portability and durability. The flexible displays are applied to various fields including TV (television), automotive displays, and wearable devices, as well as mobile devices like smartphones and tablet PCs. There is a demand for flexible displays in a variety of free forms (unconventional shapes), rather than in traditional square shapes so that they can find applications in many fields.

Since such a free form display device has a different shape than those of the existing display devices, the arrangement of components of the display device varies. For example, a line arrangement structure required for the free form display device is different from those of the existing display devices. That is, there is a need for the development of a novel, efficient line arrangement structure that suits the characteristics of a free form display device and prevents a short-circuit fault, etc. between different signal lines to which different signals (or voltages) are applied.

SUMMARY

Accordingly, the present invention is directed to a free form display device that prevents degradation in luminance uniformity and a short circuit between signals lines to which different signals are applied, by changing signal transmission paths to which a power supply voltage or scan pulses are applied.

A display device includes, a substrate comprising a free form active area having pixels defined by scan lines, data lines, and power supply lines, at least two of the power supply lines having different lengths in the free form active area; a bezel area located outside the free form active area and having a power supply routing line to which a power supply voltage is applied and a scan routing line to which scan pulses is applied; and link lines that are disposed in the bezel area and connect the power supply routing lines to the power supply lines and which are configured to transmit the power supply voltage from the power supply routing line to the power supply lines, the link lines comprising: a plurality of first link lines, at least one of the first link lines comprising one end connected to the power supply routing line and another end connected to a corresponding one of the power supply lines, said at least one of the first link lines extending in a first direction; and one or more second link lines that connect to one or more of the first link lines, at least one of the second link lines extending in a second direction different from the first direction.

The display device may also comprise a plurality of first auxiliary link lines, at least one of the first auxiliary link lines comprising one end connected to the power supply routing line and another end connected to a corresponding one of the second link lines.

The display device may further comprise second auxiliary link lines, at least one of the second auxiliary link lines comprising one end that is connected to either one of the second link lines or one of the power supply lines and another end that is connected to either one of the second link lines or one of the power supply lines.

The display device may further comprise a gate drive circuit configured to supply scan pulse to the scan lines and select pixels from the display device to write a data voltage.

The scan routing lines may be connected to the lead-in part of a gate drive circuit and the scan routing lines may be formed on a different layer than the lead-in part of the gate drive circuit and the scan lines.

The scan routing line may be formed with at least one insulating layer in between the scan routing line and the lead-in part.

The free form active area may be circular in shape, and the bezel area outside the free form active area comprises a link area including the plurality of first link lines and the one or more second link lines adjacent to and surrounding the free form active area; the power supply routing line to and surrounding the link area; and a gate drive circuit configured to supply scan pulses to the scan lines, the gate drive circuit adjacent to and surrounding the power supply routing line.

In another aspect of the present invention, a display device comprises a free form active area; power supply lines, at least two of the power supply lines having different lengths in the free form active area; a power supply routing line to which a power supply voltage is applied; and a plurality of first link lines, at least one of the first link lines connecting the power supply routing line to a corresponding one of the power supply lines, at least one of the first link lines extending in a first direction; and one or more second link lines connected to one or more of the first link lines, at least one of the second link lines extending in a second direction different from the first direction.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
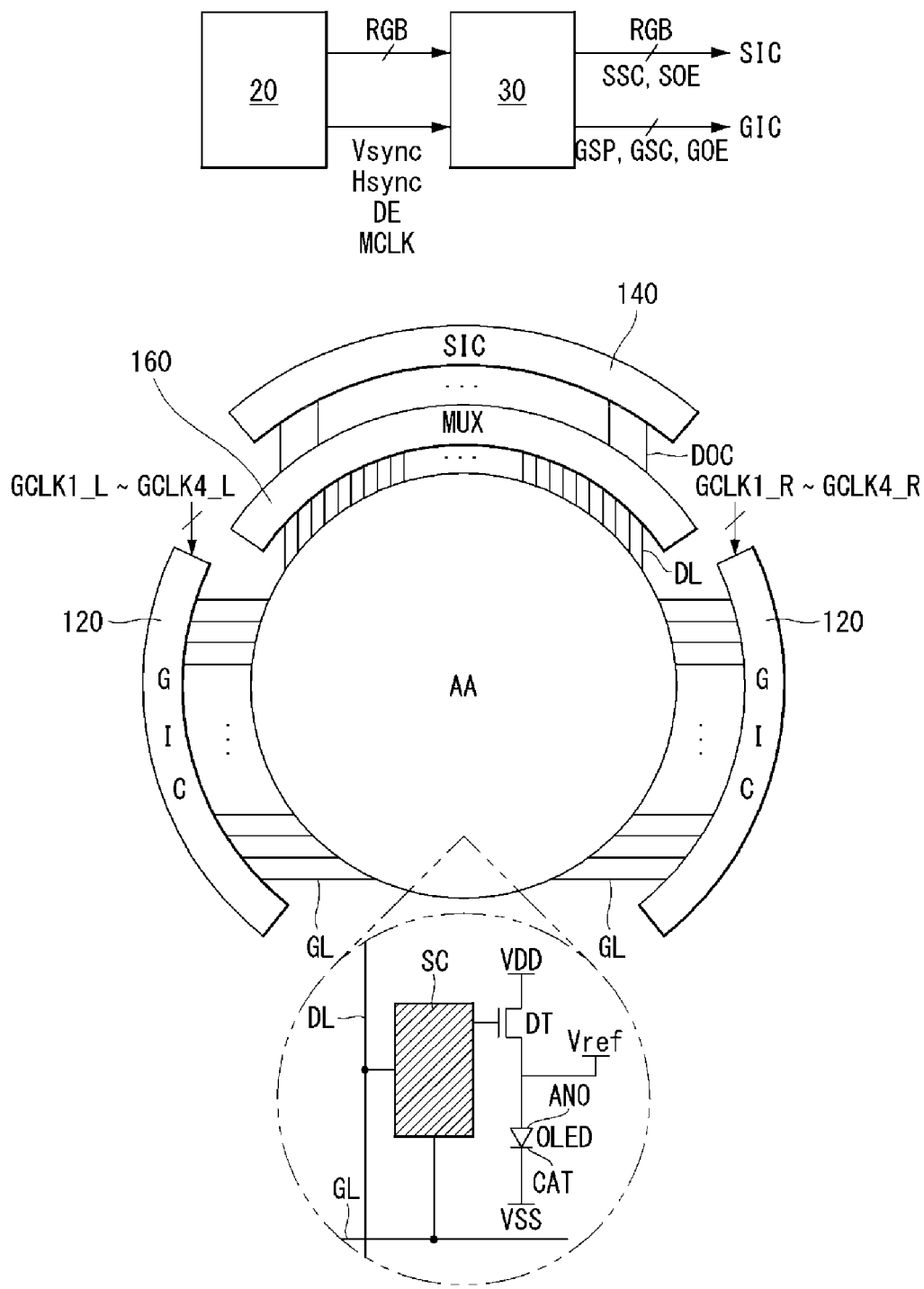
FIG. 1 is a block diagram illustrating a display device according to the present invention.

Reference will now be made in detail to embodiments illustrated in the accompanying drawings. Wherever possible, the same reference numbers are used in the drawings and the description to refer to the same or like parts. Detailed description of known arts will be omitted if it is determined that the arts are not needed to explain the working of the embodiments of the invention. In describing various embodiments, descriptions of the same or like parts will be given with respect to a particular embodiment and may be omitted in other exemplary embodiments.

Although terms including ordinal numbers such as first and second may be used to describe various components, the components are not limited by the terms. The terms are used only to distinguish one component from other components.

When a component is described as being "linked" or "connected" to another component, a component may be directly linked or connected to another component, it should be understood, however, that another component may be present in the middle. Meanwhile, when a component is described as being "directly linked" or "directly connected" to another component, it should be understood that another component may not be present in the middle.

A display device according to the present invention may be implemented based on display devices such as liquid crystal displays (LCD), field emission displays (FED), plasma display panels (PDP), organic light emitting display (OLED), electrophoresis displays (EPD), etc. For convenience of explanation, the following description will be given with respect to a display device comprising organic light emitting diodes.

Figure 2:
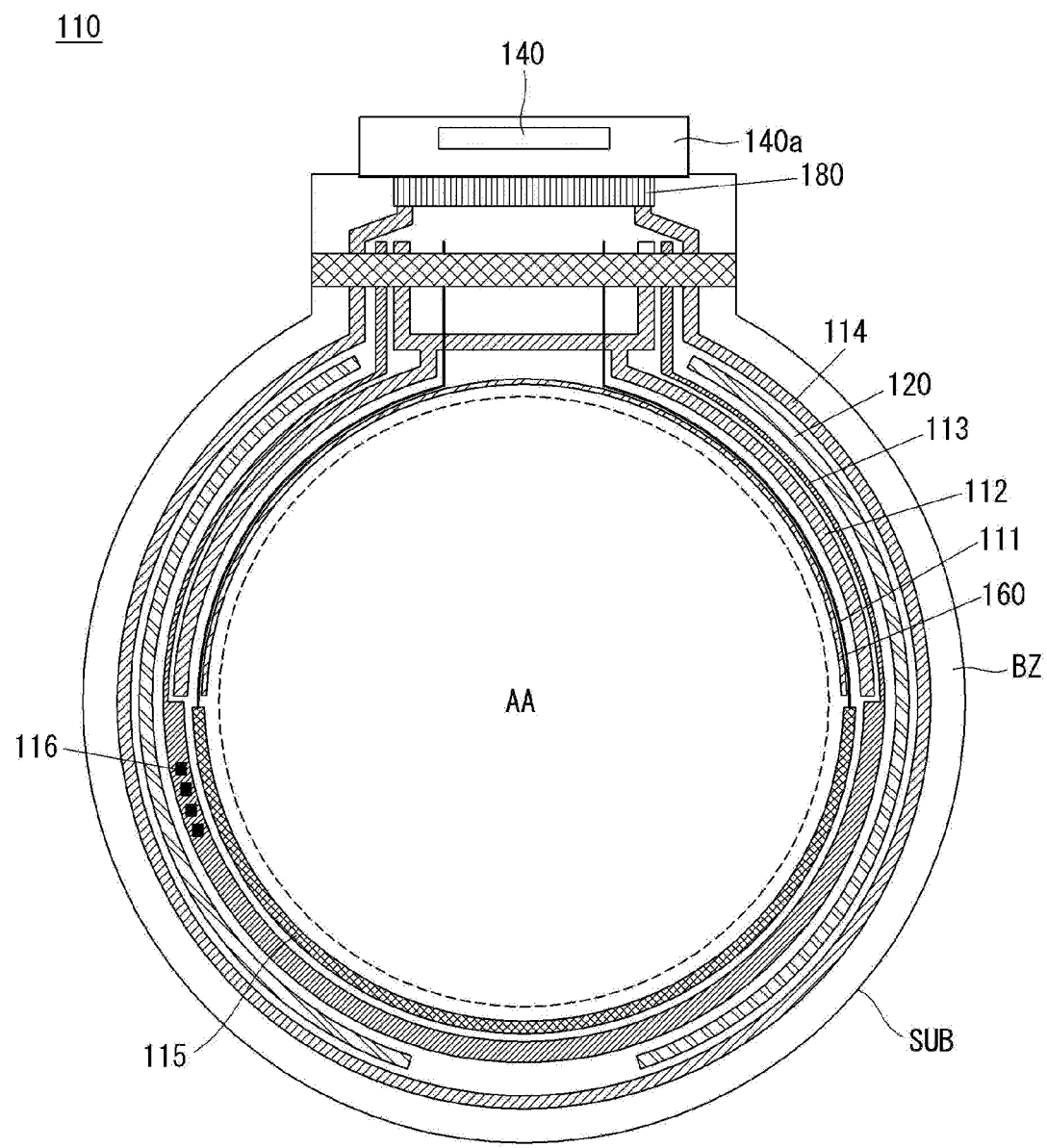
FIG. 2 is a view showing a display panel according to the present invention.
Figure 3:
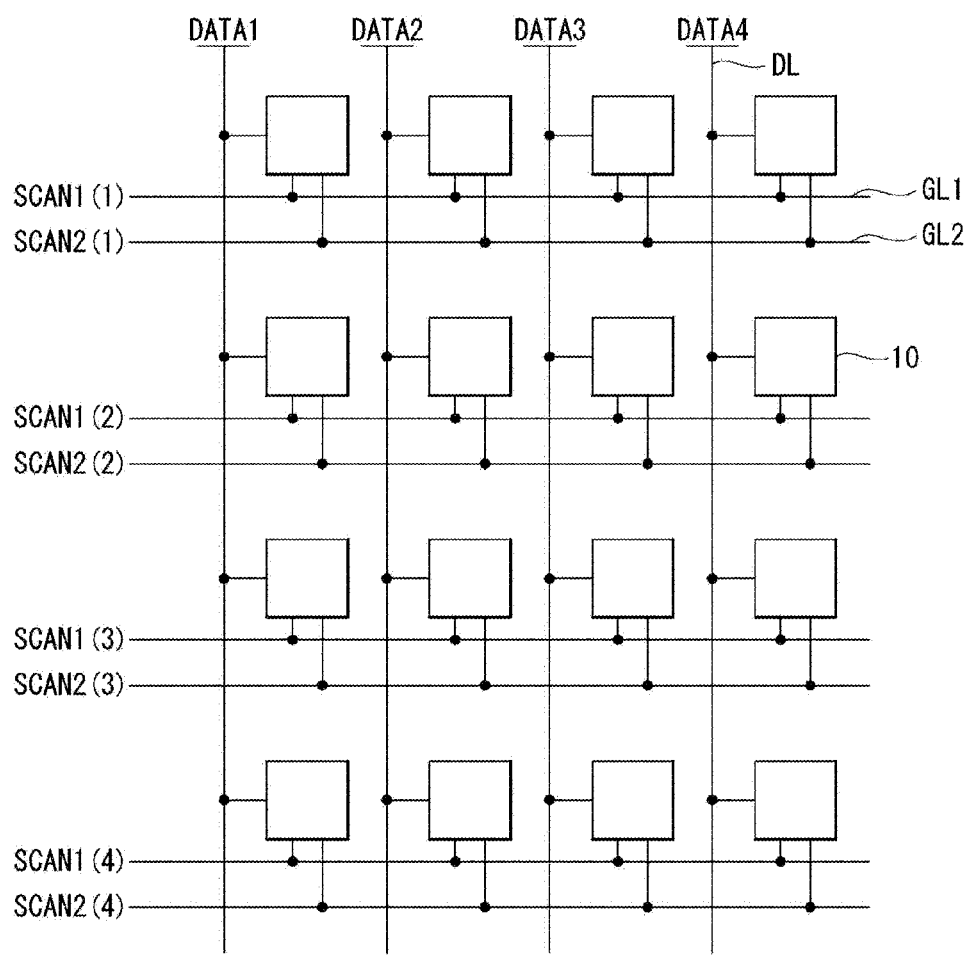
FIG. 3 is a view schematically illustrating part of a pixel array.
Figure 4:
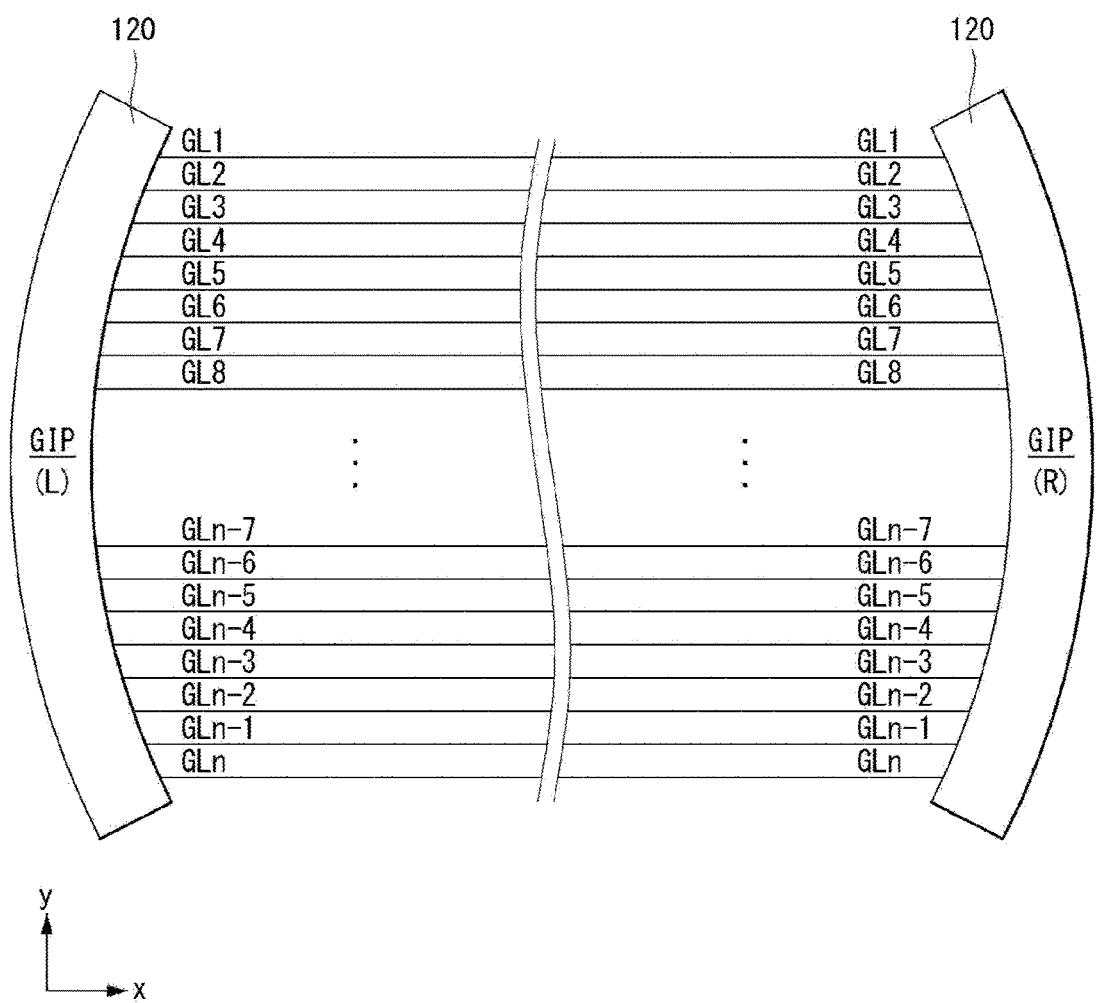
FIGS. 4 and 5 are views illustrating various patterns of how a gate drive circuit and scan lines are connected, with GIP circuits arranged on either side of the display panel.
Figure 5:
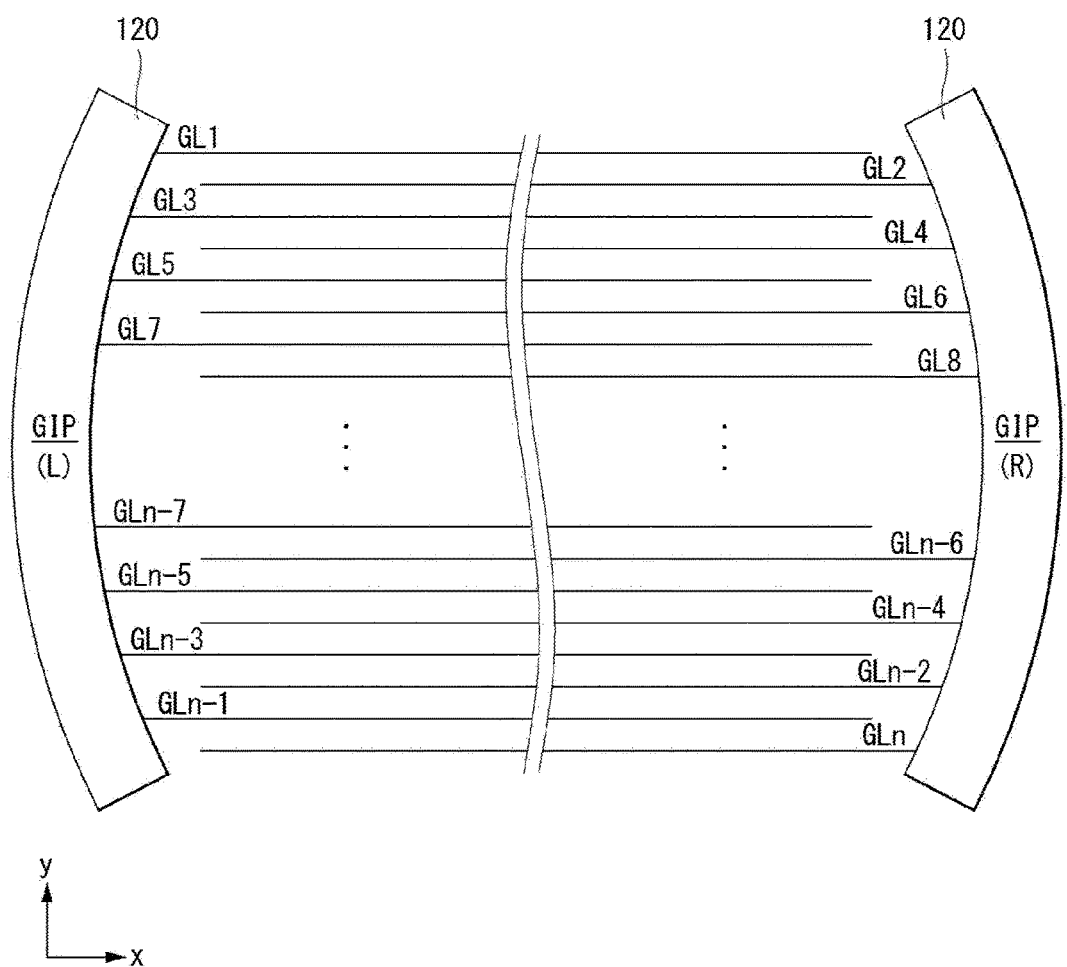

FIG. 1 is a block diagram illustrating a display device according to the present invention. FIG. 2 is a view showing a display panel according to the present invention. FIG. 3 is a view schematically illustrating part of a pixel array. FIGS. 4 and 5 are views illustrating various patterns of how a gate drive circuit and scan lines are connected, with GIP circuits arranged on either side of the display panel.

Referring to FIGS. 1 through 3, a display device according to the present invention comprises a display driver circuit and a display panel 110.

The display driver circuit comprises a gate drive circuit 120, a data drive circuit 140, and a timing controller 30, and writes a video data voltage of an input image in the pixels of the display panel 110. The data drive circuit 140 converts digital video data RGB input from the timing controller 30 to an analog gamma compensation voltage to generate a data voltage. The data voltage output from the data drive circuit 140 is supplied to data lines DL. The gate drive circuit 120 sequentially supplies a scan pulse synchronized with the data voltage to scan lines GL and selects pixels from the display panel 110 to write the data voltage.

The timing controller 30 receives timing signals, such as a vertical synchronization signal Vsync, a horizontal synchronization signal Hsync, a data enable signal DE, a main clock MCLK, etc., input from a host system 20, and synchronizes the timings of operation of the data drive circuit 140 and gate drive circuit 120. Data timing control signals for controlling the data drive circuit 140 include a source sampling clock SSC, a source output enable signal SOE, etc. Gate timing control signals for controlling the gate drive circuit 120 include a gate start pulse GSP, a gate shift clock GSC, a gate output enable signal GOE, etc.

The host system 20 may be implemented as one among a television system, a set-top box, a navigation system, a DVD player, a Blu-ray player, a personal computer (PC), a home theater system, and a phone system. The host system 20 comprises a system-on-chip (SoC) with a scaler embedded in it, and converts the digital video data RGB of the input image into a data format suitable for display on the display panel 110. The host system 20 transmits the digital video data RGB and the timing signals Vsync, Hsync, DE, and MCLK to the timing controller 30.

A substrate SUB forming the appearance of the display panel 110 is not limited to particular shapes. That is, although the substrate SUB shown in the drawings will be described with respect to one that is roughly circular in shape, but is not limited thereto. The plane of the substrate SUB may vary in shape from polygons and circles to ovals. The following description will be made by taking a circular substrate SUB as an example.

The display panel 110 comprises an active area AA and a bezel area BZ. The active area AA has an odd shape, rather than traditional rectangular shapes. The plane of the active area AA may be identical to or different from the plane of the substrate SUB. For example, a circular active area AA may be defined on a display panel 110 having a circular appearance. The following description will be made by taking a circular active area AA as an example.

The active area AA comprises data lines DL, scan lines GL crossing the data lines DL, and pixels 10 defined by a matrix of the data lines DL and scan lines GL. Data of an input image is displayed in the active area AA. The active area AA further comprises reference voltage lines (hereinafter, "REF lines") for supplying a reference voltage Vref to the pixels 10, and high voltage lines (hereinafter, "VDD lines") for supplying a high voltage to the pixels 10. The scan lines GL supply scan pulses to the pixels 10. The scan lines GL comprise first scan lines GL1 to which a first scan pulse SCAN1 is applied, and second scan lines GL2 to which a second scan pulse SCAN2 is applied. The data lines DL transmit a data voltage to the pixels 10.

Each pixel 10 comprises a red subpixel, green subpixel, and blue subpixel for color representation. Each pixel 10 may further comprise a white subpixel. The data lines DL, scan lines GL, REF lines, VDD lines, etc. are connected to each pixel 10.

Each pixel 10 comprises a driving thin film transistor (hereinafter, TFT) DT for controlling the amount of current flowing through the OLED, and a programming part SC for setting the gate-source voltage of the driving TFT DT. The programming part SC may comprise at least one switching TFT and at least one storage capacitor. The switching TFT turns on in response to a scan pulse from a scan line GL to thereby apply a data voltage from a data line DL to one electrode of the storage capacitor. The driving TFT DT adjusts the amount of light emitted by the organic light emitting diode (hereinafter, OLED) by controlling the amount of current supplied to the OLED based on the amount of voltage stored in the storage capacitor. The amount of light emitted by the OLED is proportional to the current supplied from the driving TFT DT. Such a pixel is connected to a high voltage source and a low voltage source and takes high voltage VDD and low voltage VSS from a power generator (not shown). The TFTs of the pixel may be implemented as p-type or n-type. Also, a semiconductor layer for the TFTs of the pixel may comprise amorphous silicon, or polysilicon, or oxide. The OLED comprises an anode ANO, a cathode CAT, and an organic compound layer interposed between the anode ANO and the cathode CAT. The anode ANO is connected to the driving TFT DT.

The bezel area BZ is disposed outside the active area AA. The bezel area BZ may comprise a data routing part 111, a multiplexer 160, a high voltage routing part 112, a reference voltage routing part 113, a gate drive circuit GIC 120, and a low voltage routing part 114. These components may be spaced apart from one another by a certain distance, in order to prevent a short circuit, or discharge, between them. To improve the aesthetic appearance of the display device, the bezel area BZ may be made as small as possible by properly separating, or minimally but adequately separating to prevent discharge, the components from one another.

The data routing part 111 may extend from a pad part 180 to either side of the bezel area BZ, and may be defined by the shape of the active area AA. The data routing part 111 is provide with a plurality of data routing lines. The data routing lines are electrically connected to the data drive circuit 140, and supply a data voltage output from the data drive circuit 140 to the pixels 10. The data routing lines of the data routing part 111 are electrically connected to pads of the pad part 180, and correspond to output channels of the data drive circuit 140 on a one-to-one basis.

The data drive circuit 140 may be mounted on a flexible circuit substrate 140a and electrically connected to the pad part 180 through an anisotropic conductive film (ACF). The flexible circuit board 140a may bend toward the back of the display panel 110. In this instance, the data drive circuit 140 may be located on the back of the display panel 110.

The multiplexer (MUX) 160 is disposed between the active area AA and the data routing part 111. The multiplexer 160 takes a data voltage from the data routing lines of the data routing part 111 and distributes it to the data lines DL in the active area AA. One end of the multiplexer 160 is electrically connected to the data routing lines of the data routing part 111, and the other end is electrically connected to the data lines DL in the active area AA. The multiplexer 160 output a data signal output from one out terminal of the data drive circuit 140 to multiple data lines DL by time-division, in response to a MUX enable signal. Accordingly, the multiplexer 160 requires fewer output terminals for the data drive circuit 140 and fewer data routing lines to connect to the output terminals.

The data routing part 111 and the multiplexer 160 may be disposed adjacent to the active area AA. The data routing part 111 and the multiplexer 160 may be disposed on only one of the upper and lower hemispheres of the active area AA. The upper hemisphere of the active area AA refers to the area above a horizontal line that goes through the center of the active area AA. The lower hemisphere of the active area AA refers to the area below the horizontal line that goes through the center of the active area AA. The data routing part 111 and the multiplexer 160 may be disposed adjacent to the data drive circuit 140.

An AP (auto probe) switching circuit 115 may be further provided on one side of the bezel area BZ. The AP switching circuit 115 is electrically connected to the scan lines GL and data lines DL in the active area AA and operates to check for the lighting-up of the pixels 10.

The high voltage routing part 112 may extend from the pad part 180 to either side, that is both left and right hand sides, of the bezel area BZ, and be defined by the shape of the active area AA. The high voltage routing part 112 may be defined outside the data routing part 111. The high voltage routing part 112 is provided with a VDD routing line. The VDD routing line takes a high voltage VDD output from a power generator. The VDD routing line is electrically connected to the VDD lines in the active area AA. The high voltage VDD is transmitted to the VDD lines through the VDD routing line. The high voltage VDD is the voltage required to drive the driving TFT of a compensating pixel or drive the OLED.

The reference voltage routing part 113 may extend from the pad part 180 to either side, that is both left and right hand sides, of the bezel area BZ, and be defined by the shape of the active area AA. The reference voltage routing part 113 may be defined outside the data routing part 111. The reference voltage routing part 113 is provided with an REF routing line. The REF routing line takes a reference voltage Vref output from a power generator. The REF routing line is electrically connected to the REF lines in the active area AA. The reference voltage Vref is transmitted to the REF lines through the REF routing line. The reference voltage Vref is the voltage required to reset the electric potential at the TFTs and OLED when the compensating pixel is driven. The reference voltage Vref may be an initial voltage VINI.

As illustrated in the drawing, either the high voltage routing part 112 or the reference voltage routing part 113 may extend from the pad part 180 and be located on the upper hemisphere, and the other one of the high voltage routing part 112 or the reference voltage routing part 113 may extend from the pad part 180 and be located on the upper and lower hemispheres. However, the present invention is not limited to this, and both the high voltage routing part 112 and the reference voltage routing part 113 may extend form the pad part 180 and may be located on the upper and lower hemispheres. In another example, if upper and lower pad parts connected to a power generator are provided, either the high voltage routing part 112 or the reference voltage routing part 113 may extend from the upper pad part and be located on the upper hemisphere, and the other one may extend from the lower pad part and be located on the lower hemisphere. The VDD routing line and REF routing line respectively disposed in the high voltage routing part 112 and reference voltage routing part 113 may be formed in such a way as to have an area large enough to keep the voltage level stable.

If the active area AA is free form, the data lines DL in the active area AA are different lengths depending on their positions. A free form shape may be a shape that is not a square. In particular, a free form shape may be a shape that is not a rectangle. A free form shape may be a circle. For a free form active area, the length of the data lines DL disposed at the center of the active area AA may be different from that of the data lines DL disposed on the outer part of the active area AA. Since the data lines DL in the active area AA are different lengths depending on their positions, the number of pixels connected to each data line DL also differs.

The differences in length between the data lines DL may create variations on capacitors. This may bring about problems like non-uniform luminance, thereby degrading the display quality of the display device.

To prevent this, the bezel area BZ may have a compensating capacitor 116. As illustrated in the drawing, the compensating capacitor 116 may be formed in the reference voltage routing part 113. However, the present invention is not limited thereto, and the compensating capacitor 116 may be formed by the overlapping of first and second capacitor electrodes, with at least one insulating layer in between. The first capacitor electrode is electrically connected to the data lines DL in the active area AA. If the compensating capacitor 116 is formed in the reference voltage routing part 113, the second capacitor electrode may be a REF routing line.

The compensating capacitor 116 may be a dual capacitor that runs vertically. A first capacitor may be formed in the upper part of the compensating capacitor 116 by the overlapping of the first and second capacitor electrodes, and a second capacitor may be formed in the lower part of the compensating capacitor 116 by the overlapping of the first capacitor electrode and a third capacitor electrode. The third capacitor electrode may be an electrode to which scan pulses supplied from the gate drive circuit 120 adjacent to it are applied.

A plurality of compensating capacitors 116 may be provided if necessary. At least one of the compensating capacitors 116 may have a different capacitance value from another one. That is, the compensating capacitors 116 may have a proper capacitance value that can compensate for variations depending on the length of the corresponding data line DL.

The gate drive circuit 120 comprises a shift register. The shift register comprises stages connected in cascade. The stages output scan pulses SCAN1 and SCAN2 in response to a start pulse GSP, and shift the output of the scan pulses SCAN1 and SCAN2 in response to shift clocks GCLK1 to GCLK4. The gate drive circuit 120 may be disposed directly in the bezel area BZ of the display panel 110 depending on the type of a GIP (gate-driver in panel) circuit.

The gate drive circuit 120 may be disposed in the bezel area BZ along the shape of the active area AA, spaced a certain distance apart from the active area AA. The gate drive circuit 120 supplies scan pulses through scan routing lines to corresponding scan lines GL. The gate drive circuit 120 may be disposed on either side of the bezel area BZ, with the active area AA at the center. However, the present invention is not limited to this, and the gate drive circuit 12 may be disposed on one side of the bezel area BZ. The gate drive circuit 120 may divide the scan lines GL into a predetermined number of groups, and supply scan pulses for each group.

For example, referring further to FIG. 4, the gate drive circuit 120 may comprise a first GIP circuit GIP(L) disposed on one side of the display panel 110, and a second GIP circuit GIP(L) disposed on the other side of the display panel 110.

The first and second GIP circuits GIP(L) and GIP(R) may be connected to all scan lines GL1 to GLn. The first and second GIP circuits GIP(L) and GIP(R) receive a start pulse GSP and, at the same time, output scan pulses. Accordingly, the scan pulses output from the first and second GIP circuits GIP(L) and GIP(R) are simultaneously applied to both ends of the same scan line GL, respectively.

In another example, referring further to FIG. 5, the first GIP circuit GIP(L) is connected to a first group of scan lines GL and sequentially supplies a scan pulse to the first group of scan lines GL. The second GIP circuit GIP(R) is connected to a second group of scan lines GL and sequentially supplies a scan pulse to the second group of scan lines GL. The first group of scan lines GL may comprise odd-numbered scan lines GL1, GL3, . . . , GL2$n$−1. The second group of scan lines GL may comprise even-numbered scan lines GL2, GL4, . . . , GL2$n$. A start pulse GSP may be supplied to the first and second GIP circuits GIP(L) and GIP(R) at different time slots. Accordingly, the first and second GIP circuits GIP(L) and GIP(R) may output a scan pulse or carry signal at different timings. For example, a first scan pulse from the first GIP circuit 120 GIP(L) may be supplied to the first scan lines GL1 first, and then after approximately 1 horizontal period, a second scan pulse from the second GIP circuit GIP(R) may be supplied to the second scan lines GL2.

The low voltage routing part 114 may extend from the pad part 180, and be defined by the shape of the active area AA. The low voltage routing part 114 may take a low voltage VSS from a power generator and supply it to the pixels 10.

If the active area AA is free form, the power supply lines (REF lines and VDD lines) in the active area AA are different lengths depending on their positions. That is, the length of the power supply lines (REF lines and VDD lines) disposed at the center of the active area AA may be different from that of the power supply lines (REF lines and VDD lines) disposed on the outer part of the active area AA. Thus, at least two of the power supply lines (REF lines) have different lengths in the active area AA. Since the power supply lines (REF lines and VDD lines) in the active area AA are different lengths depending on their positions, the number of pixels connected to each power supply line (REF lines and VDD lines) also differs. Accordingly, there may be load variations between the power supply lines (REF lines and VDD lines). This may bring about problems like non-uniform luminance, thereby degrading the display quality and product reliability of the display device.

Exemplary embodiments of the present invention, which are devised to reduce load variations caused by differences in length between power supply lines, will be described below with reference to the accompanying drawings. For ease of explanation, a signal transmission path for applying the reference voltage Vref, among the power supply voltages VDD and Vref, will be described by way of example. It should be noted that the present invention is not limited to such an example.

First Exemplary Embodiment

Figure 6:
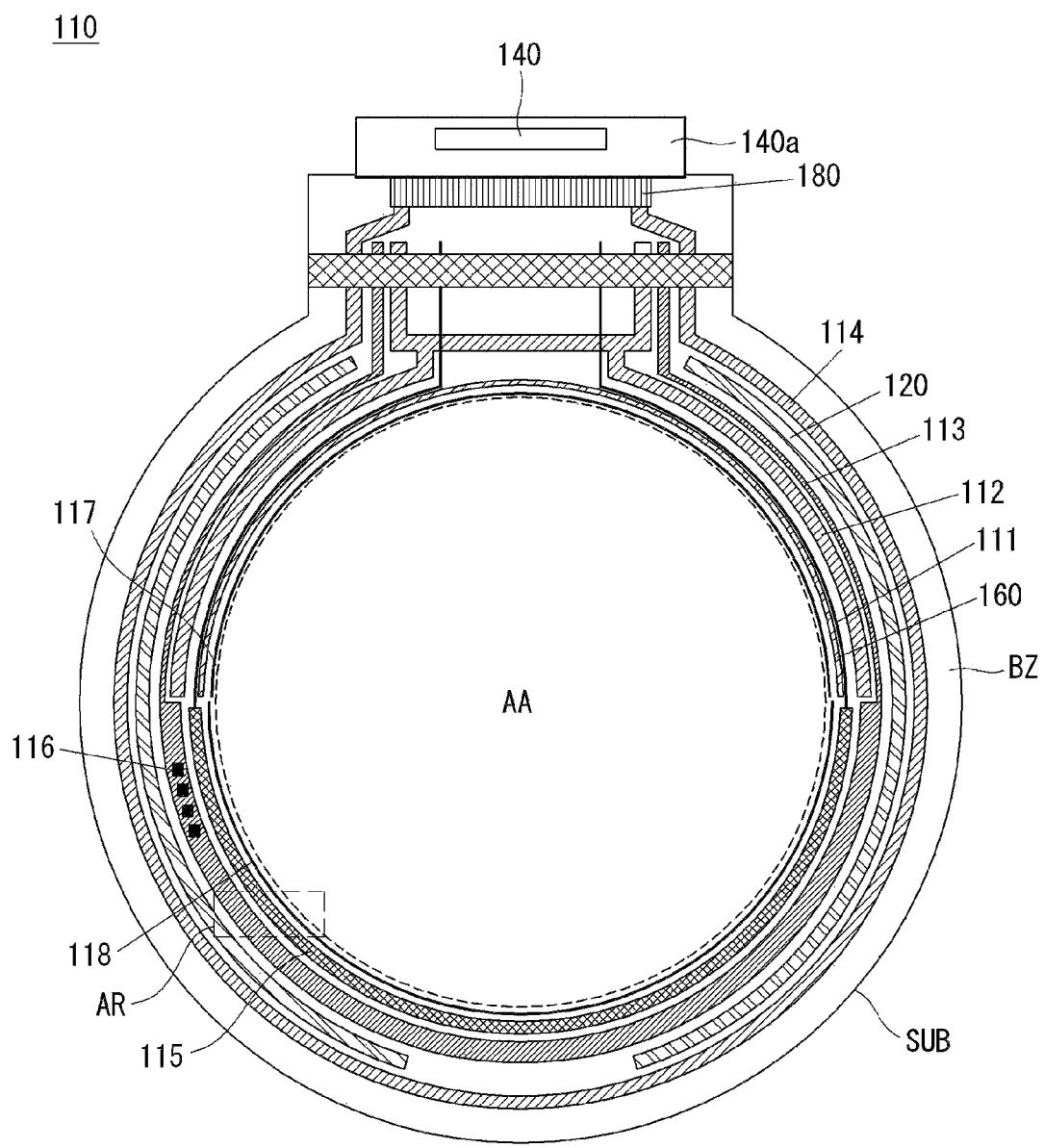
FIG. 6 is a top plan view illustrating a display panel according to the present invention.
Figure 7:
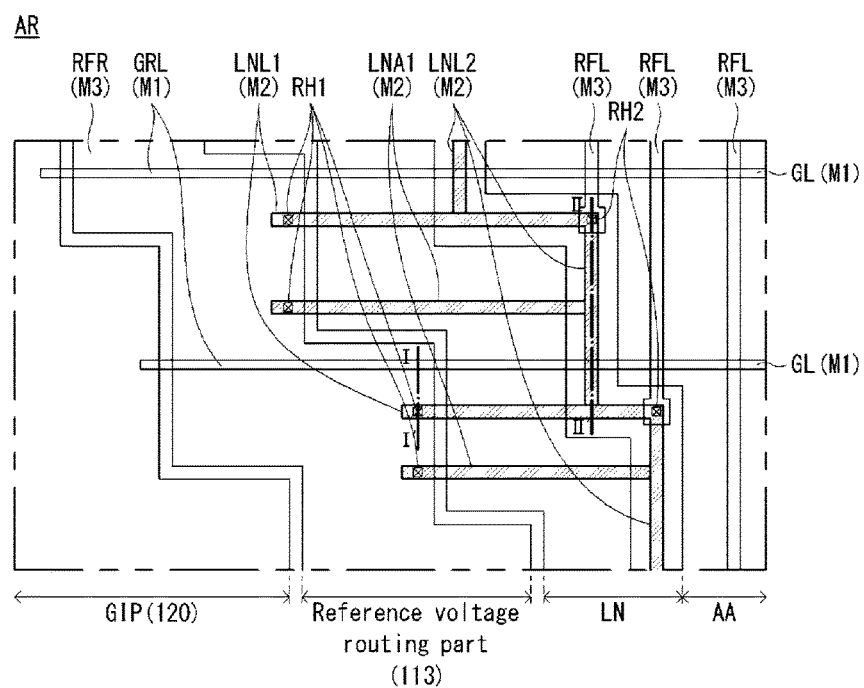
FIG. 7 is a top plan view illustrating the AR area of FIG. 6, in the display device according to a first exemplary embodiment of the present invention.
Figure 8:
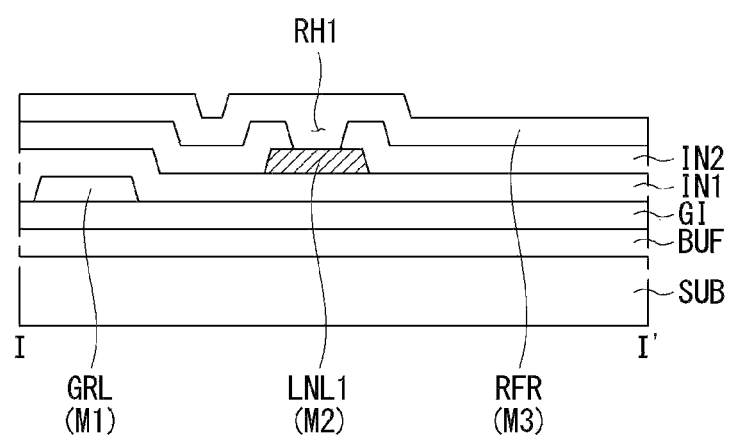
FIG. 8 is a cross-sectional view taken along line I-I' of FIG. 7.
Figure 9:
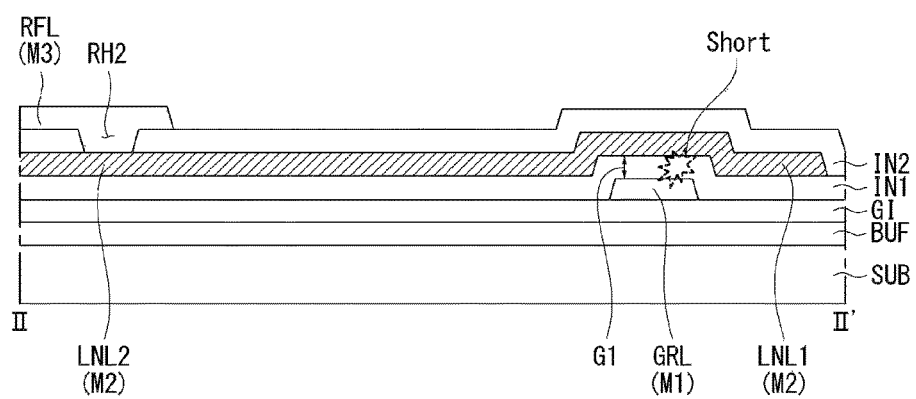
FIG. 9 is a cross-sectional view taken along line II-II' of FIG. 7.

A display device according to a first exemplary embodiment of the present invention will be described below with reference to FIGS. 6 through 9. FIG. 6 is a top plan view illustrating a display panel according to the present invention. FIG. 7 is a top plan view illustrating the AR area of FIG. 6, in the display device according to the first exemplary embodiment of the present invention. FIG. 8 is a cross-sectional view taken along line I-I' of FIG. 7. FIG. 9 is a cross-sectional view taken along line II-II' of FIG. 7.

Referring to FIGS. 6 and 7, the display panel according to the present invention comprises a substrate SUB and link lines LNL1 and LNL2. The substrate SUB comprises a free form active area AA and a bezel area BZ located outside the active area AA. The free form active area AA may be circular in shape. Pixels 10 defined by scan lines GL, data lines DL, and REF lines RFL are arranged in the free form active area AA. A gate drive circuit 120, a reference voltage routing part 113, and a link area LN are located in the bezel area BZ.

The gate drive circuit 120 may be formed on the substrate SUB of the display panel by GIP technology. The gate drive circuit 120 generates scan pulses. The gate drive circuit 120 supplies scan pulses SCAN1 and SCAN2 to the scan lines GL in the active area AA under control of a timing controller 30. The gate drive circuit 120 and the scan lines GL are electrically connected through scan routing lines GRL provided in between them. The scan pulses from the gate drive circuit 120 are supplied to the scan lines GL through the scan routing lines GRL.

The reference voltage routing part 113 is provided with an REF routing line RFR. The REF routing line RFR receives a reference voltage Vref from a power generator. A plurality of driving elements and a plurality of electrodes to which different signals (or voltages) are applied are disposed in a space (hereinafter, "link area") LN between the reference voltage routing part 113 and the active area AA, with insulating layers of organic and/or inorganic insulating materials interposed between the driving elements and the electrodes. For example, AP switching circuit elements 115, the link lines LNL1 and LNL2, and the scan routing lines GRL may be disposed in the link area LN. The link lines LNL1 and LNL2 and the scan routing lines GRL run across the link area LN.

The link lines LNL1 and LNL2 are disposed in the bezel area BZ, and connect the REF routing line RFR to the REF lines RFL to transmit the reference voltage Vref from the REF routing line RFR to the REF lines RFL. That is, the reference voltage Vref is supplied to the REF lines RFL in the active area AA through a signal transmission path connecting to the REF routing line RFR and the link lines LNL1 and LNL2. The bezel area BZ outside the free form active area AA may comprise the link area LN including the link lines LNL1 and LNL2 adjacent to and surrounding the free form active area AA, the power supply routing line (REF routing line RFR) adjacent to and surrounding the link area LN, and the gate drive circuit 120 adjacent to and surrounding the power supply routing line.

The link lines LNL1 and LNL2 comprise first link lines LNL1 and second link lines LNL2. The first link lines LNL1 extend from the reference voltage routing part 113 through the link area LN and are electrically connected to the REF lines RFL. At least one of the first link lines LNL1 comprises one end connected to the power supply routing line and another end connected to a corresponding one of the power supply lines (REF lines RFL). To this end, one end of the first link lines LNL1 is connected to the REF routing line RFR of the reference voltage routing part 113, and the other end of the first link lines LNL1 is connected to the REF lines RFL in the active area AA. At least one of the first link lines LNL1 may extend in a first direction. Additionally, the first link lines LNL1 may extend in a first direction. The first direction may be along a direction of the scan lines.

One or more second link lines LNL2 connect to one or more of the first link lines LNL1. Additionally, the second link lines LNL2 electrically connect n first link lines LNL1 (n is an integer greater than or equal to 2). One end and the other end of the second link lines LNL2 are connected to different first link lines LNL1, respectively. The second link lines LNL2 may serve as a bridge that connects the first link lines LNL1. The second link lines LNL2 may be disposed adjacent to the active area AA. The second link lines LNL2 may compensate for load variations caused by differences in length between the REF lines RFL in the active area AA. Accordingly, the first exemplary embodiment of the present invention may provide a display device that prevents degradation in luminance uniformity. At least one of the second link lines LNL2 may extend in a second direction different from the first direction. Additionally, the second link lines LNL2 may extend in a second direction different from the first direction. The second direction may be along a direction of the data lines.

The bezel area BZ may have a large number of second link lines LNL2 to interconnect multiple first link lines LNL1. The term interconnect may be taken to mean the joining of two components in such a way that electrical contact is formed between the two components. The larger the number of second lines LNL2, the easier for the REF lines RFL to be equipotential. The reference voltage can be supplied uniformly to the REF lines RFL by having a sufficient number of second link lines LNL2.

In order for the REF lines RFL to be equipotential, the display device may further comprise first auxiliary link lines LNA1. Unlike the first link lines LNL1 connecting the REF routing line RFR and the REF lines RFL, the first auxiliary link lines LNA1 connect the REF routing line RFR and the second link lines LNL2. At least one of the first auxiliary link lines LNA1 comprises one end connected to the REF routing line RFR and another end connected to a corresponding one of the second link lines LNL2. A large number of first auxiliary link lines LNA1 may be provided in the bezel area BZ. The larger the number of first auxiliary link lines LNA1, the easier for the REF lines RFL to be equipotential. The reference voltage can be supplied uniformly to the REF lines RFL by having a sufficient number of first auxiliary link lines LNA1.

Reference numeral 118 of FIG. 6 schematically illustrates an example in which link lines to which the reference voltage Vref is applied are interconnected in an area adjacent to the active area AA. Link lines to which the high voltage VDD is applied may be connected, as indicated by reference numeral 117 of FIG. 6. However, the present invention is not limited to this example.

Reference numerals M1, M2, M3, and M4 put in brackets in the drawing denote first, second, third, and forth conductive layers, respectively, to which different signals (or voltages) are applied, and which serve as transmission paths for these signals. The reference numerals in brackets are used to distinguish the layers where each signal line is formed, and the same reference numeral in brackets denotes signal lines on the same layer. It should be noted that the same reference numeral in brackets does not necessarily mean that the same signal is applied to the signal lines.

Referring further to FIGS. 7 and 8, connections among the REF routing line RFR, link lines LNL1 and LNL2, and REF lines RFL will be described using a stack structure.

Referring further to FIGS. 7 and 8, numerous insulating layers are disposed on the substrate SUB. For example, a buffer layer BUF, a gate insulating layer GI, a first insulating layer IN1, and a second insulating layer IN2 may be disposed on the substrate SUB.

The scan routing lines GRL are disposed between the gate insulating layer GI and the first insulating layer IN1. The scan routing lines GRL transmit scan pulses to the scan lines GL disposed between the gate insulating layer GI and the first insulating layer IN1. The first link lines LNL1 and the second link lines LNL2 are disposed between the first insulating layer IN1 and the second insulating layer IN2. For example, the first link lines LNL1 and the second link lines LNL2 are formed in a first layer. Additionally, there may be first auxiliary link lines LNA1, and the first link lines LNL1, the second link lines LNL2, and the first auxiliary link lines LNA1 are formed in a first layer.

The REF routing line RFR and the RFR lines RFL are disposed on the second insulating layer IN2. For example, the power supply routing line (REF routing line RFR) and the power supply lines (RFR lines RFL) are formed in a second layer. The REF routing line RFR is connected to the first link lines LNL1 via contact holes RH1 penetrated into the second insulating layer IN2. The REF lines RFL are connected to the first link lines LNL1 via contact holes RH2 penetrated into the second insulating layer IN2. For example, the first layer and the second layer are separated by an insulating layer (IN2), and a first contact hole (RH1) connects one end of one of the first link lines LNL1 to the power supply routing line (REF routing line RFR), and a second contact hole (RH2) connects another end of said one of the first link lines LNL1 to one of the power supply lines (REF lines RFL). The contact holes RH2 that bring the REF lines RFL and the first link lines LNL1 into contact with each other may be disposed on the outer part of the active area AA, adjacent to the active area AA. However, the present invention is not limited to this.

The display device may prevent load variations caused by differences in length depending on the positions of the REF lines RFL by having the first link lines LNL1, second lines LNL2, and first auxiliary link lines LNA1. The present invention may provide a display device that is improved in display quality and product reliability by preventing degradation in luminance uniformity.

However, because a plurality of signal lines to which different signals are applied and a plurality of driving elements are disposed in the link area LN, a short circuit or interference may occur between the signals lines to which different signals are applied.

Specifically, in the link area LN, the scan routing lines GRL, to which scan pulses are applied, and the link lines LNL1 and LNL2, to which the reference voltage Vref is applied, are disposed on different layers, with the first insulating layer IN1 in between. Especially, the second link lines LNL2 cross the scan routing lines GRL, with only the first insulating layer IN1 in between. The distance G1 between the second link lines LNL2 and the scan routing lines GRL is very short since the second link lines LNL2 are vertically adjacent to the scan routing lines GRL.

If the second link lines LNL2 and the scan routing lines GRL, to which different signals are applied, are disposed adjacent to each other, the insulating layer, e.g., first insulating layer IN1, between the second link lines LNL2 and the scan routing lines GRL may be fused due to applied static electricity, etc., thus resulting in an insulation breakdown. Therefore, a short circuit may occur between the second link lines LNL2 and the scan routing lines GRL. Moreover, a large current flows into the gate drive circuit 120 and/or power generator through the adjacent second link lines LNL2 and scan routing lines GRL, thereby causing circuit damage.

Second Exemplary Embodiment

A second exemplary embodiment of the present invention provides a display device which compensates for load variations caused by differences in length between REF lines RFL by having first and second link lines LNL2, and which prevents a short circuit caused by the proximity between second link lines LNL2 and scan routing lines GRL to which different signals are applied.

Figure 10:
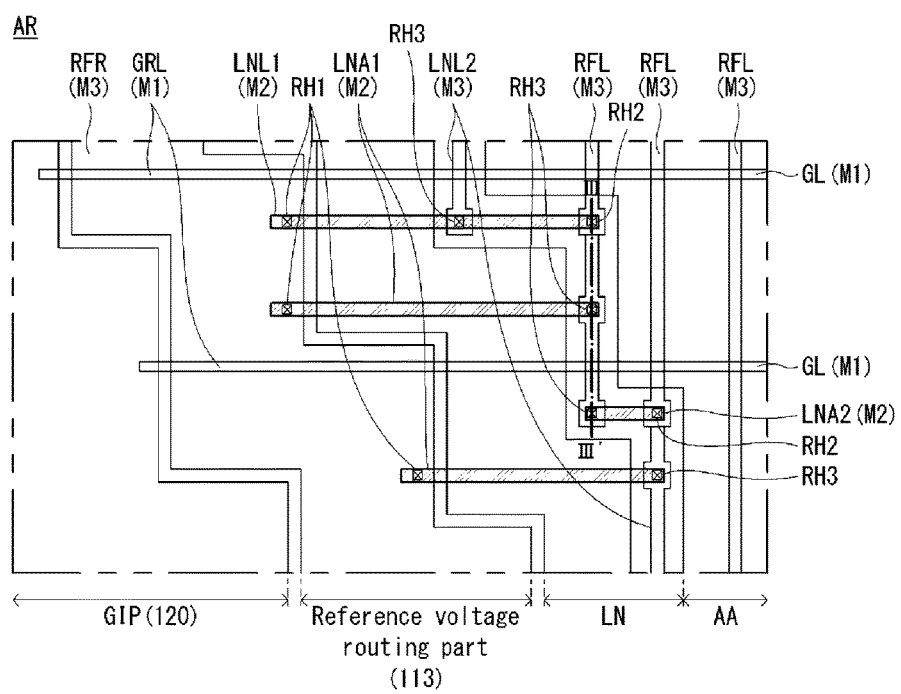
FIG. 10 is a top plan view illustrating the AR area of FIG. 6, in the display device according to a second exemplary embodiment of the present invention.
Figure 11:
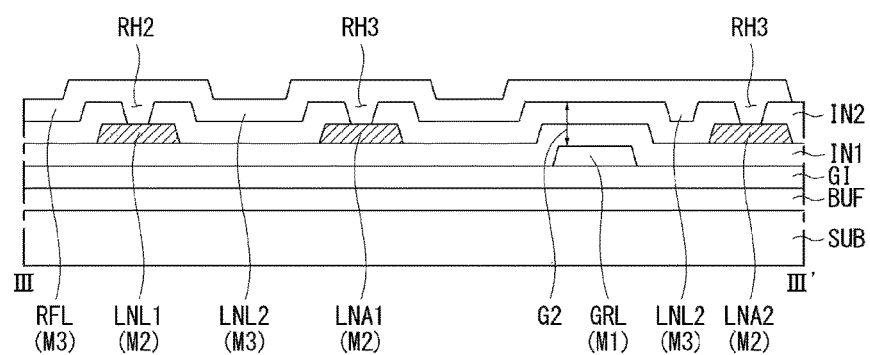
FIG. 11 is a cross-sectional view taken along line III-III' of FIG. 10.

Referring to FIGS. 10 and 11, a display device according to the second exemplary embodiment of the present invention will be described below. FIG. 10 is a top plan view illustrating the AR area of FIG. 6, in the display device according to the second exemplary embodiment of the present invention. FIG. 11 is a cross-sectional view taken along line III-III' of FIG. 10.

Referring to FIGS. 6 and 10, a display panel according to the present invention comprises a substrate SUB and link lines LNL1 and LNL2. The substrate SUB comprises a free form active area AA and a bezel area BZ located outside the active area AA. The free form active area AA may be circular in shape. Pixels 10 defined by scan lines GL, data lines DL, and REF lines RFL are arranged in the free form active area AA. A gate drive circuit 120, a reference voltage routing part 113, and a link area LN are located in the bezel area BZ.

The gate drive circuit 120 may be formed on the substrate SUB of the display panel by GIP technology. The gate drive circuit 120 generates scan pulses. The gate drive circuit 120 supplies scan pulses SCAN1 and SCAN2 to the scan lines GL in the active area AA under control of a timing controller 30. The gate drive circuit 120 and the scan lines GL are electrically connected through scan routing lines GRL provided in between them. The scan pulses from the gate drive circuit 120 are supplied to the scan lines GL through the scan routing lines GRL.

The reference voltage routing part 113 is provided with an REF routing line RFR. The REF routing line RFR receives a reference voltage Vref from a power generator. A plurality of driving elements and a plurality of electrodes to which different signals (or voltages) are applied are disposed in a space (hereinafter, "link area") LN between the reference voltage routing part 113 and the active area AA, with insulating layers of organic and/or inorganic insulating materials interposed between the driving elements and the electrodes. For example, AP switching circuit elements 115, the link lines LNL1 and LNL2, and the scan routing lines GRL may be disposed in the link area LN. The link lines LNL1 and LNL2 and the scan routing lines GRL run across the link area LN.

The link lines LNL1 and LNL2 are disposed in the bezel area BZ, and connect the REF routing line RFR to the REF lines RFL to transmit the reference voltage Vref from the REF routing line RFR to the REF lines RFL. That is, the reference voltage Vref is supplied to the REF lines RFL in the active area AA through a signal transmission path connecting to the REF routing line RFR and the link lines LNL1 and LNL2. The bezel area BZ outside the free form active area AA may comprise the link area LN including the link lines LNL1 and LNL2 adjacent to and surrounding the free form active area AA, the power supply routing line (REF routing line RFR) adjacent to and surrounding the link area LN, and the gate drive circuit 120 adjacent to and surrounding the power supply routing line.

The link lines LNL1 and LNL2 comprise first link lines LNL1 and second link lines LNL2. The first link lines LNL1 extend from the reference voltage routing part 113 through the link area LN and are electrically connected to the REF lines RFL. At least one of the first link lines LNL1 comprises one end connected to the power supply routing line and another end connected to a corresponding one of the power supply lines (REF lines RFL). To this end, one end of the first link lines LNL1 is connected to the REF routing line RFR of the reference voltage routing part 113 via contact holes RH1, and the other end of the first link lines LNL1 is connected to the REF lines RFL in the active area AA via contact holes RH2. At least one of the first link lines LNL1 may extend in a first direction. Alternatively, the first link lines LNL1 may extend in a first direction. The first direction may be along a direction of the scan lines.

One or more second link lines LNL2 connect to one or more of the first link lines LNL1. Additionally, the second link lines LNL2 may electrically connect n first link lines LNL1 (n is an integer greater than or equal to 2). The second link lines LNL2 extend from the REF lines RFL toward the outer part of the active area AA. That is, the second link lines LNL2 and the REF lines RFL are formed as a single body. Accordingly, the REF lines RFL run through the active area AA, and extend toward the bezel area BZ. One end of the second link lines LNL2 is connected to the REF lines RFL. The other end of the second link lines LNL2 is connected to the first link lines LNL1 via contact holes RH3. Accordingly, the first link lines LNL1 may be connected to the REF lines RFL via the contact holes RH2, and connected to the second link lines LNL2 extending from the REF lines RFL via the contact holes RH3. One first link line LNL1 may be connected to an REF line RFL via a contact hole RH2, and at the same time connected to a second link line LNL2 via a contact hole RH3. At least one of the second link lines LNL2 may extend in a second direction different from the first direction. Alternatively, the second link lines LNL2 may extend in a second direction different from the first direction. The second direction may be along a direction of the data lines.

The second link lines LNL2 may compensate for load variations caused by differences in length between the REF lines RFL in the active area AA by interconnecting the first link lines LNL1. The present invention provides a display device that can prevent degradation in luminance uniformity.

The bezel area BZ may have a large number of second link lines LNL2 to interconnect multiple first link lines LNL1. The larger the number of second lines LNL2, the easier for the REF lines RFL to be equipotential. The reference voltage can be supplied uniformly to the REF lines RFL by having a sufficient number of second link lines LNL2.

In order for the REF lines RFL to be equipotential, the present invention may further comprise first auxiliary link lines LNA1. Unlike the first link lines LNL1 connecting the REF routing line RFR and the REF lines RFL, the first auxiliary link lines LNA1 connect the REF routing line RFR and the second link lines LNL2. At least one of the first auxiliary link lines LNA1 comprises one end connected to the REF routing line RFR and another end connected to a corresponding one of the second link lines LNL2. A large number of first auxiliary link lines LNA1 may be provided in the bezel area BZ. The larger the number of first auxiliary link lines LNA1, the easier for the REF lines RFL to be equipotential. The reference voltage can be supplied uniformly to the REF lines RFL by having a sufficient number of first auxiliary link lines LNA1.

In order for the REF lines RFL to be equipotential, the present invention may further comprise second auxiliary link lines LNA2. At least one of the second auxiliary link lines LNA2 comprises one end that is connected to either one of the second link lines LNL2 or one of the REF lines RFL and another end that is connected to either one of the second link lines LNL2 or one of the REF lines RFL. Additionally, one end of the second auxiliary link lines LNA2 may be connected to either the second link lines LNL2 or the REF lines RFL, and the other end of the second auxiliary link lines LNA2 is connected to either the second link lines LNL2 or the REF lines RFL. In an example, the second auxiliary link lines LNA2 connect the second link lines LNL2 and the REF lines RFL. In another example, the second auxiliary link lines LNA2 connect the REF lines RFL. That is, the second auxiliary link lines LNA2 are not directly connected to the REF routing line RFR. The second auxiliary link lines LNA2 are different from the first link lines LNL1 connecting the REF routing line RFR and the RFR lines RFL. The second auxiliary link lines LNA2 are different from the second link lines LNL2 connecting the REF lines RFL and the first link lines LNL1. A large number of second auxiliary link lines LNA2 may be provided in the bezel area BZ. The larger the number of second auxiliary link lines LNA2, the easier for the REF lines RFL to be equipotential. The reference voltage can be supplied uniformly to the REF lines RFL by having a sufficient number of second auxiliary link lines LNA2.

Referring further to FIG. 11, connections among the REF routing line RFR, link lines, and REF lines RFL will be described using a stack structure.

Referring further to FIG. 11, numerous insulating layers are disposed on the substrate SUB. For example, a buffer layer BUF, a gate insulating layer GI, a first insulating layer IN1, and a second insulating layer IN2 may be disposed on the substrate SUB.

The scan routing lines GRL are disposed between the gate insulating layer GI and the first insulating layer IN1. The scan routing lines GRL transmit scan pulses to the scan lines GL disposed between the gate insulating layer GI and the first insulating layer IN1. The first link lines LNL1 and the second auxiliary link lines LNA2 are disposed between the first insulating layer IN1 and the second insulating layer IN2. For example, the first link lines LNL1 and the second auxiliary link lines LNA2 may be formed in a first layer. Alternatively, the first link lines LNL1 may be formed in a first layer, or the first link lines LNL1, the first auxiliary link lines LNA1 and the second auxiliary link lines LNA2 may be formed in a first layer.

The REF routing line RFR, the RFR lines RFL, and the second link lines LNL2 are disposed on the second insulating layer IN2. For example, the second link lines LNL2, the power supply routing line (REF routing line RFR) and the power supply lines (REF lines RFL) may be formed in a second layer. The REF routing line RFR is connected to the first link lines LNL1 via contact holes RH1 penetrated into the second insulating layer IN2. The REF lines RFL are connected to the first link lines LNL1 via contact holes RH2 penetrated into the second insulating layer IN2. The REF lines RFL are connected to the second auxiliary link lines LNA2 via contact holes RH2 penetrated into the second insulating layer IN2. The contact holes RH2 that bring the REF lines RFL and the first link lines LNL1 into contact with each other may be disposed on the outer part of the active area AA, adjacent to the active area AA. However, the present invention is not limited to this.

The second link lines LNL2 are formed on the same layer as the REF lines RFL, and directly connected to the REF lines RFL. The second link lines LNL2 and the REF lines RFL are formed as a single body. The second link lines LNL2 are connected to the first link lines LNL1 via contact holes RH3 penetrated into the second insulating layer IN2. The second link lines LNL2 are connected to the second auxiliary link lines LNA2 via contact holes RH3 penetrated into the second insulating layer IN2.

In the second exemplary embodiment of the present invention, the first link lines LNL1 and the second link lines LNL2 are disposed on different layers. That is, the second link lines LNL2 are disposed above the first link lines LNL1, with an insulating layer in between. Accordingly, in the link area LN, the second link lines LNL2 and the scan routing lines GRL cross each other, with the first and second insulating layers IN1 and IN2 in between.

The second exemplary embodiment of the present invention can prevent a short circuit between the second link lines LNL2 and scan routing lines GRL to which different signals are applied, as compared to the first exemplary embodiment, by keeping enough distance G2 between the second link lines LNL2 and the scan routing lines GRL.

The present invention may prevent load variations caused by differences in length depending on the positions of the REF lines RFL by having the first link lines LNL1, second lines LNL2, first auxiliary link lines LNA1, and second auxiliary link lines LNA2. Accordingly, the present invention may provide a display device that is improved in display quality and product reliability by preventing degradation in luminance uniformity.

Third Exemplary Embodiment

A third exemplary embodiment of the present invention provides a display device which more efficiently prevents a short circuit caused by the proximity between second link lines LNL2 and scan routing lines GRL to which different signals are applied, as compared to the second exemplary embodiment. In describing the third exemplary embodiment, redundancies between the second and third exemplary embodiments will be omitted.

Figure 12:
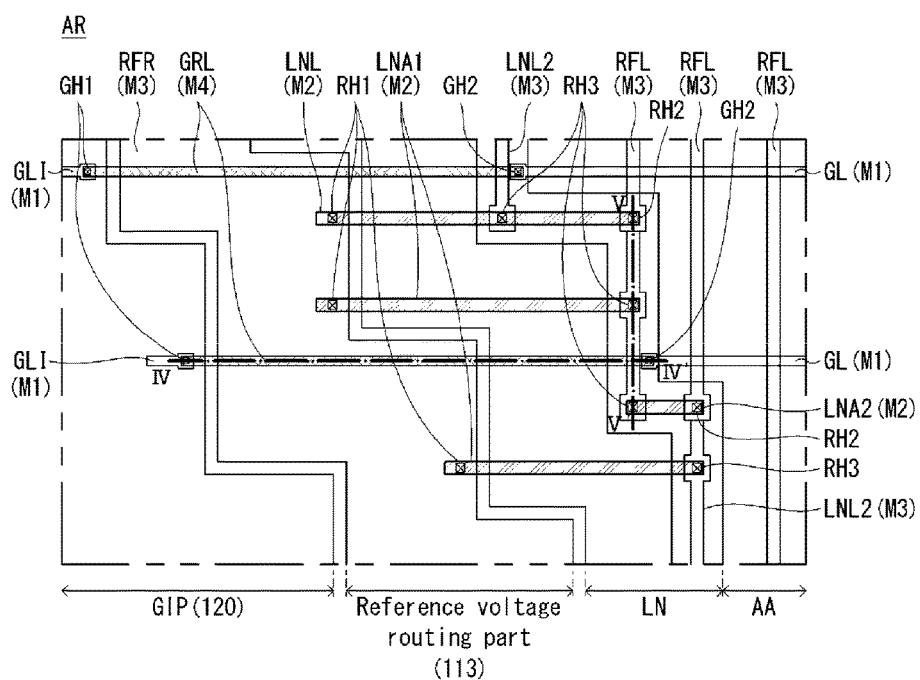
FIG. 12 is a top plan view illustrating the AR area of FIG. 6, in the display device according to a third exemplary embodiment of the present invention
Figure 13:
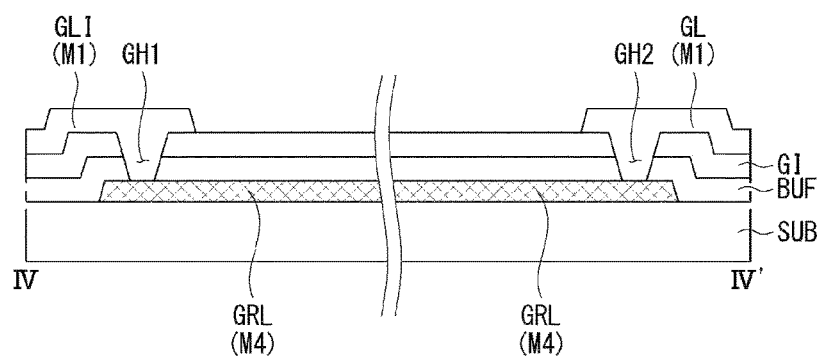
FIG. 13 is a cross-sectional view taken along line IV-IV' of FIG. 12.
Figure 14:
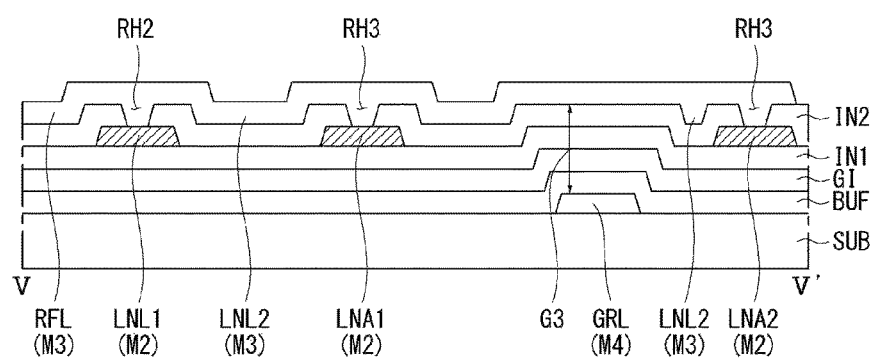
FIG. 14 is a cross-sectional view taken along line V-V' of FIG. 12.

Referring to FIGS. 12 and 14, a display device according to the third exemplary embodiment of the present invention will be described below. FIG. 12 is a top plan view illustrating the AR area of FIG. 6, in the display device according to a third exemplary embodiment of the present invention. FIG. 13 is a cross-sectional view taken along line IV-IV' of FIG. 12. FIG. 14 is a cross-sectional view taken along line V-V' of FIG. 12.

Referring to FIG. 12, the gate drive circuit 120 may be formed on the substrate SUB of the display panel by GIP technology. The gate drive circuit 120 generates scan pulses. The gate drive circuit 120 supplies scan pulses SCAN1 and SCAN2 to the scan lines GL in the active area AA under control of a timing controller 30. The gate drive circuit 120 and the scan lines GL are electrically connected through scan routing lines GRL provided in between them. The scan pulses from the gate drive circuit 120 are supplied to the scan lines GL through the scan routing lines GRL.

The scan routing lines GRL extend from a lead-in part GLI of the gate drive circuit 120, and are connected to the scan lines GL in the active area AA. One end of the scan routing lines GRL is connected to the lead-in part GLI of the gate drive circuit 120, and the other end is connected to the scan lines GL. Scan pulses are generated from the gate drive circuit 120 and supplied to the scan lines GL through the lead-in part GLI of the gate drive circuit 120 and the scan routing lines GRL. The scan routing lines GRL run across the reference voltage routing part 113 and the link area LN.

Referring further to FIG. 13, the third exemplary embodiment of the present invention is characterized in that the scan routing lines GRL are formed on a different layer than the lead-in part GLI of the gate drive circuit 120 and the scan lines GL. For example, a scan routing line GRL is formed in a third layer, and the lead-in part of the gate drive circuit 120 and the scan lines GL are formed in a fourth layer. The scan routing lines GRL are formed below the lead-in part GLI of the gate drive circuit 120 and the scan lines GL, with at least one insulating layer in between.

One end of the scan routing lines GRL is connected to the lead-in part GLI of the gate drive circuit 120 via contact holes GH1 penetrated into the gate insulating layer GI and buffer layer BUF. The other end of the scan routing lines GRL is connected to the scan lines GL via contact holes GH2 penetrated into the gate insulating layer GI and buffer layer BUF.

Referring further to FIG. 14, in the third exemplary embodiment of the present invention, the first link lines LNL1 and the second link lines LNL2 are disposed on different layers. That is, the second link lines LNL2 are disposed above the first link lines LNL1, with an insulating layer in between. Also, in the third exemplary embodiment of the present invention, the scan routing lines GRL, the lead-in part GLI of the gate drive circuit 120, and the scan lines GL are disposed on different layers. That is, the scan routing lines GRL are disposed below the lead-in part GLI of the gate drive circuit 120 and the scan lines GL, with an insulating layer in between. Accordingly, in the link area LN, the second link lines LNL2 and the scan routing lines GRL cross each other, with the buffer layer BUF, gate insulating layer GI, first insulating layer IN1, and second insulating layer IN2 in between.

The third exemplary embodiment of the present invention can more efficiently prevent a short circuit between the second link lines LNL2 and scan routing lines GRL to which different signals are applied, as compared to the second exemplary embodiment, by keeping enough distance G3 between the second link lines LNL2 and the scan routing lines GRL.

The present invention can prevent a short circuit between signal lines to which different signals are applied, by using novel signal transmission paths.

Moreover, the present invention can compensate for load variations caused by differences in length depending on the positions of the scan lines by adding or changing signal transmission paths to which a power supply voltage is applied. Accordingly, the present invention provides a display device that is improved in display quality and product reliability by preventing degradation in luminance uniformity.

Although embodiments have been described with reference to a number of illustrative embodiments thereof, it should be understood that numerous other modifications and embodiments can be devised by those skilled in the art that will fall within the scope of the claims of this disclosure. More particularly, numerous variations and modifications are possible in the component parts and/or arrangements of the subject combination arrangement within the scope of the appended claims. In addition to variations and modifications in the component parts and/or arrangements, alternative uses will also be apparent to those skilled in the art.

What is claimed is:
1. A display device comprising:
   a substrate comprising: a free form active area having pixels defined by scan lines, data lines, and power supply lines, at least two of the power supply lines having different lengths in the free form active area; a bezel area located outside the free form active area and having a power supply routing line to which a power supply voltage is applied and a scan routing line to which scan pulses is applied, wherein the free form active area is non-rectangular in shape; and
   link lines that are disposed in the bezel area and connect the power supply routing line to the power supply lines and which are configured to transmit the power supply voltage from the power supply routing line to the power supply lines, and second auxiliary link lines;

the link lines comprising:

a plurality of first link lines, at least one of the first link lines comprising one end connected to the power supply routing line and another end connected to a corresponding one of the power supply lines or one end connected to the power supply routing line and another end connected to one of one or more second link lines, said at least one of the first link lines extending in a first direction; and the one or more second link lines that connect to one or more of the first link lines, at least one of the second link lines extending in a second direction different from the first direction, wherein one of the second auxiliary link lines connects the second link lines separated from each other, the power supply lines separated from each other, or at least one of the second link lines and at least one of the power supply lines, wherein the second auxiliary link lines and the second link lines are disposed in different layers with at least one insulating layer interposed therebetween.

2. The display device of claim 1, wherein the display device further comprises a plurality of first auxiliary link lines, at least one of the first auxiliary link lines comprising one end connected to the power supply routing line and another end connected to a corresponding one of the second link lines.

3. The display device of claim 1, wherein:

the display device further comprises a gate drive circuit configured to supply scan pulses to the scan lines and select pixels from the display device to write a data voltage, wherein the scan routing line is connected to a lead-in part of the gate drive circuit; and wherein the scan routing line is formed on a different layer than the lead-in part of the gate drive circuit and the scan lines.

4. The display device of claim 3, further comprising at least one insulating layer in between the scan routing line and the lead-in part.

5. The display device of claim 1, wherein the first link lines are along the first direction and the second link lines are along the second direction.

6. The display device of claim 1, wherein the first direction is along a direction of the scan lines and the second direction is along a direction of the data lines.

7. The display device of claim 1, wherein the free form active area is circular in shape and the bezel area outside the free form active area comprises:

a link area including the plurality of first link lines and the one or more second link lines adjacent to and surrounding the free form active area;

the power supply routing line adjacent to and surrounding the link area; and a gate drive circuit configured to supply scan pulses to the scan lines, the gate drive circuit adjacent to and surrounding the power supply routing line.

8. The display device of claim 1, wherein:

the first link lines and the second link lines are formed in a first layer; and the power supply routing line and the power supply lines are formed in a second layer.

9. The display device of claim 8, wherein:

the first layer and the second layer are separated by an insulating layer, and a first contact hole connects one end of one of the first link lines to the power supply routing line, and a second contact hole connects another end of said one of the first link lines to one of the power supply lines.

10. The display device of claim 2, wherein:

the first link lines, the second link lines and the first auxiliary link lines are formed in a first layer; and the power supply routing line and the power supply lines are formed in a second layer.

11. The display device of claim 1, wherein:

the first link lines are formed in a first layer; and the second link lines, the power supply routing line and the power supply lines are formed in a second layer.

12. The display device of claim 1, wherein:

the first link lines, the first auxiliary link lines and the second auxiliary link lines are formed in a first layer; and the second link lines, the power supply routing line and the power supply lines are formed in a second layer.

13. The display device of claim 3, wherein:

the first link lines, the first auxiliary link lines and the second auxiliary link lines are formed in a first layer;

the second link lines, the power supply routing line and the power supply lines are formed in a second layer;

the scan routing line is formed in a third layer; and the lead-in part of the gate drive circuit and the scan lines GL are formed in a fourth layer.

14. A display device comprising:

a free form active area, the free form active area being non-rectangular in shape;

power supply lines configured to supply a power supply voltage to pixels of the display device, at least two of the power supply lines having different lengths in the free form active area;

a power supply routing line to which the power supply voltage is applied; and a plurality of first link lines, at least one of the first link lines connecting the power supply routing line to a corresponding one of the power supply lines or connecting the power supply routing line to a corresponding one of one or more second link lines, at least one of the first link lines extending in a first direction;

the one or more second link lines connected to one or more of the first link lines, at least one of the second link lines extending in a second direction different from the first direction; and second auxiliary link lines;

wherein one of the second auxiliary link lines connects the second link lines separated from each other, the power supply lines separated from each other, or at least one of the second link lines and at least one of the power supply lines, and wherein the second auxiliary link lines and the second link lines are disposed in different layers with at least one insulating layer interposed therebetween.

15. The display device of claim 14, wherein the display device further comprises a plurality of first auxiliary link lines, at least one of the first auxiliary link lines comprising one end connected to the power supply routing line and another end connected to a corresponding one of the second link lines.

16. The display device of claim 14, further comprising a gate drive circuit configured to supply scan pulses to scan lines and select pixels from the display device to write a data voltage,
- wherein a scan routing line is connected to a lead-in part of the gate drive circuit; and
- wherein the scan routing line is formed on a different layer than the lead-in part of the gate drive circuit and the scan lines.

17. The display device of claim 16, further comprising at least one insulating layer in between the scan routing line and the lead-in part.

18. The display device of claim 14, wherein the free form active area is circular in shape and a bezel area outside the free form active area comprises:
- a link area including the plurality of first link lines and the one or more second link lines adjacent to and surrounding the free form active area;
- the power supply routing line adjacent to and surrounding the link area; and
- a gate drive circuit configured to supply scan pulses to the scan lines, the gate drive circuit adjacent to and surrounding the power supply routing line.

* * * * *